(12) United States Patent
Horiguchi et al.

(10) Patent No.: US 8,299,631 B2
(45) Date of Patent: Oct. 30, 2012

(54) SEMICONDUCTOR ELEMENT AND DISPLAY DEVICE PROVIDED WITH THE SAME

(75) Inventors: Takeshi Horiguchi, Osaka (JP); Takashi Matsui, Osaka (JP); Motoji Shiota, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 48 days.

(21) Appl. No.: 13/061,456

(22) PCT Filed: Jun. 11, 2009

(86) PCT No.: PCT/JP2009/060663
§ 371 (c)(1),
(2), (4) Date: Mar. 29, 2011

(87) PCT Pub. No.: WO2010/024015
PCT Pub. Date: Mar. 4, 2010

(65) Prior Publication Data
US 2011/0193239 A1   Aug. 11, 2011

(30) Foreign Application Priority Data
Sep. 1, 2008  (JP) ................. 2008-223755

(51) Int. Cl.
*H01L 23/52* (2006.01)
*H01L 23/48* (2006.01)
*H01L 29/40* (2006.01)

(52) U.S. Cl. ............ 257/786; 257/E23.021; 257/778; 257/779; 438/108; 438/612; 345/87; 345/204; 349/152

(58) Field of Classification Search .......... 257/E23.01, 257/E23.021, 773–776, 778–781, 736, 738; 438/108, 109, 612–614; 361/760; 345/87, 345/90, 204; 349/33, 149, 152
See application file for complete search history.

(56) References Cited

U.S. PATENT DOCUMENTS

| | | | | |
|---|---|---|---|---|
| 6,329,969 | B1 * | 12/2001 | Yano .................. | 345/87 |
| 6,867,490 | B2 * | 3/2005 | Toyosawa ............ | 257/692 |
| 6,956,548 | B2 * | 10/2005 | Yarita et al. ......... | 345/87 |

(Continued)

FOREIGN PATENT DOCUMENTS

JP     11-307902 A     11/1999
(Continued)

OTHER PUBLICATIONS

International Search Report (ISR) issued in PCT/JP2009/060663 (International application) mailed in Jul. 2009 for Examiner consideration, citing U.S. Patent Application Publication Nos. 2-3 and Foreign Patent document Nos. 3-5 listed above.

*Primary Examiner* — Chris Chu
(74) *Attorney, Agent, or Firm* — Chen Yoshimura LLP

(57) ABSTRACT

Provided is a semiconductor element in which decrease in reliability of wiring is suppressed. A driver IC (10) has a plurality of output bumps (12) arranged in the direction (direction A) along the long sides (11a and 11b). The output bumps include a plurality of source bumps (12a) arranged near the center section of the long side, and a plurality of gate bumps (12b) arranged towards the end portions of the long side. The source bumps are arranged close to the long side (11a), and the gate bumps are arranged closer to the long side (11b) than the source bumps.

11 Claims, 8 Drawing Sheets

U.S. PATENT DOCUMENTS

| | | | |
|---|---|---|---|
| 7,002,809 B2* | 2/2006 | Lee | 361/789 |
| 7,144,758 B2* | 12/2006 | Yuzawa | 438/108 |
| 7,224,424 B2* | 5/2007 | Hwang et al. | 349/152 |
| 7,327,411 B2* | 2/2008 | Yoon et al. | 349/33 |
| 7,449,787 B2* | 11/2008 | Yamate et al. | 257/786 |
| 7,450,393 B2* | 11/2008 | Hwang et al. | 361/760 |
| 7,486,284 B2* | 2/2009 | Hwang et al. | 345/204 |
| 7,894,033 B2* | 2/2011 | Matsuura | 349/149 |
| 7,903,067 B2* | 3/2011 | Yoon et al. | 345/90 |
| 8,063,497 B2* | 11/2011 | Tang et al. | 257/786 |
| 2002/0096781 A1* | 7/2002 | Toyosawa | 257/777 |
| 2004/0108594 A1* | 6/2004 | Toyosawa | 257/734 |
| 2005/0052442 A1 | 3/2005 | Takenaka et al. | |
| 2005/0195130 A1 | 9/2005 | Hwang et al. | |
| 2008/0024475 A1 | 1/2008 | Takenaka et al. | |

FOREIGN PATENT DOCUMENTS

| | | |
|---|---|---|
| JP | 2003-263117 A | 9/2003 |
| JP | 2005-62582 A | 3/2005 |
| JP | 2005-182012 A | 7/2005 |
| JP | 2005-309018 A | 11/2005 |

* cited by examiner

SEMICONDUCTOR ELEMENT AND DISPLAY DEVICE PROVIDED WITH THE SAME

TECHNICAL FIELD

The present invention relates to a semiconductor element and a display device equipped with the same. More particularly, the present invention relates to a semiconductor element having a plurality of terminals and a display device equipped with the same.

BACKGROUND ART

A display device equipped with a semiconductor element having a plurality of terminals is known as a conventional technology. FIG. 12 is a plan view showing a configuration of a display device equipped with a semiconductor element of a conventional example. FIG. 13 is a plan view showing a configuration of a semiconductor element of the conventional example shown in FIG. 12. FIG. 14 is a plan view showing a configuration of a display panel of the display device of the conventional example shown in FIG. 12. FIG. 15 is a cross-sectional view of the semiconductor element of the conventional example shown in FIG. 12 as it is mounted on the display panel.

As shown in FIG. 12, a display device 501 equipped with a semiconductor element 510 of a conventional example includes a semiconductor element 510 and a display panel 520 with the semiconductor element 510 mounted thereon. As shown in FIG. 13, the semiconductor element 510 includes a main surface 511 of a rectangular shape having two long sides 511a and 511b and two short sides 511c and 511d. On the main surface 511, a plurality of output bumps 512 and a plurality of input bumps 513 are provided and are aligned in the direction (direction A) along the long sides 511a and 511b, respectively.

The plurality of output bumps 512 are arranged close to the long side 511a, while the plurality of input bumps 513 are arranged close to the long side 511b. The plurality of output bumps 512 are arranged to form two rows of terminals. Also, the plurality of output bumps 512 are arranged in a staggered fashion. The plurality of input bumps 513 are arranged to form a row of terminals.

The plurality of output bumps 512 are arranged in the direction A at a pitch of 16 µm, for example. Also, the plurality of output bumps 512 include a plurality of (hundreds of) source bumps 512a that are arranged about the center of the long side 511a and also a plurality of (hundreds of) gate bumps 512b that are arranged towards the ends of the long side 511a. The plurality of source bumps 512a constitute a source output section 512c, and the plurality of gate bumps 512b constitute a gate output section 512d.

As shown in FIG. 12, the display panel 520 includes a display section 521 and also a margin section 522 that is formed along an edge of the display panel 520. In the margin section 522, a mounting area 522a is provided for the semiconductor element 510 to be mounted thereon.

In the mounting area 522a, as shown in FIG. 14, a plurality of pads 523 are formed at positions corresponding to the plurality of output bumps 512 of the semiconductor element 510 (see FIG. 13). Also, pads (not shown) are formed at positions corresponding to the plurality of input bumps 513 of the semiconductor element 510 (see FIG. 13).

The pads 523 include a plurality of source pads 523a that are arranged at positions corresponding to the plurality of source bumps 512a (see FIG. 13) and also a plurality of gate pads 523b that are arranged at positions corresponding to the plurality of gate bumps 512b (see FIG. 13). The plurality of source pads 523a constitute a source section 523c, while the plurality of gate pads 523b constitute a gate section 523d.

A plurality of wirings 524, which are formed so as to extend to the display section 521 (see FIG. 12), are connected to the source pads 523a and the gate pads 523b. The source pads 523a are connected to one side of the display section 521 in the direction B through the wirings 524, while the gate pads 523b are connected to both sides of the display section 521 in the direction A through the wirings 524.

In the display device 501 of the conventional example, when mounting the semiconductor element 510 to the display panel 520, the semiconductor element 510 is bonded to the display panel 520 by thermocompression with an ACF (anisotropic conductive film; not shown) or the like sandwiched between the output bumps 512 and input bumps 513 of the semiconductor element 510 and the pads 523 and pads (not shown) of the display panel 520.

The above-described display device is disclosed in literatures such as Patent Document 1 and Patent Document 2.

RELATED ART DOCUMENTS

Patent Documents

Patent Document 1: Japanese Patent Application Laid-Open Publication No. H11-307902
Patent Document 2: Japanese Patent Application Laid-Open Publication No. 2005-182012

SUMMARY OF THE INVENTION

Problems to be Solved by the Invention

In the above-described display device 501 of the conventional example, however, the output bumps 512 (the pads 523) have a small pitch and are large in number. Therefore, when the width in the direction B of the margin section 522 of the display panel 520 is reduced for a smaller display panel 520 (display device 501), the line width and spacing (L/S) of the wirings 524 connected to the pads 523 become small, as shown in FIG. 14. Here, since the wirings 524 connected to the gate pads 523b are routed to both sides of the display section 521 in the direction A, the line width and spacing (L/S) of the wirings 524 become especially small.

As a result, because of variations in manufacturing or other factors, inconveniences such as an increase in wiring resistance due to the lack of sufficient line width of the wirings 524 or leaks between lines due to an insufficient line spacing of wirings 524 can occur. These inconveniences can lead to a problem of decreased reliability of the wirings 524.

The present invention was devised to solve the above-described problems and is aiming at providing a semiconductor element that is capable of suppressing the decrease in reliability of wirings, and also a display device equipped with such semiconductor element.

Means for Solving the Problems

To achieve the aforementioned objectives, a semiconductor element according to a first aspect of the present invention is configured to be mounted on a display panel that includes a display section, includes a main surface of a rectangular shape having two long sides and two short sides, and includes a plurality of output terminals disposed on the main surface, arranged in the direction along a long side and to be electrically connected to the display section of the display panel, wherein the plurality of output terminals include a plurality of first terminals arranged about the center of a long side and a plurality of second terminals arranged towards the ends of the long side; and at least the first terminals among the plurality of output terminals are arranged close to one of the two long sides, and at least some of the second terminals are arranged closer to the other of the two long sides than the first terminals.

In the semiconductor element of the first aspect, as described above, at least some of the second terminals are arranged closer to the other of the two long sides than the first terminals, thereby making it possible to arrange at least some of panel terminals of the display panel corresponding to the second terminals closer to the other of the two long sides than panel terminals of the display panel corresponding to the first terminals. As a result, the area for disposing wirings connected to the panel terminals of the display panel can be made larger by the amount of the displacement of the terminals towards the other long side. This further allows for an increase in the line width and spacing (L/S) of the wirings connected to the panel terminals. This also makes it possible to suppress problems caused by variations in manufacturing or other factors, such as an increase in wiring resistance due to the lack of sufficient line width of the wiring or leaks between lines due to an insufficient line spacing of the wiring. As a result, decrease in reliability of the wirings can be suppressed.

In the semiconductor element of the above-described first aspect, the second terminals are preferably arranged progressively closer to the other of the two long sides from the center of the long side towards the ends thereof. This configuration allows for an increased area for disposing wirings connected to the panel terminals of the display panel corresponding to the second terminals. As a result, the line width and spacing (L/S) of the wirings connected to the panel terminals of the display panel corresponding to the second terminals can easily be increased.

In this case, all of the plurality of output terminals are preferably arranged progressively closer to the other of the two long sides from the center of the long side towards the ends thereof. This configuration allows for an increased area for disposing the wirings connected to the panel terminals of the display panel corresponding to all of the plurality of output terminals. As a result, the line width and spacing (L/S) of the wirings connected to the panel terminals of the display panel corresponding to all of the plurality of output terminals can easily be increased.

As described above, the semiconductor element according to the first aspect further includes a plurality of input terminals disposed on the main surface in the direction along a one long side, wherein the plurality of input terminals are arranged close to the other of the two long sides; and at least some of the second terminals are arranged closer to the one of the two long sides than the input terminals. This configuration allows at least some of the second terminals to be arranged closer to the other of the two long sides than the first terminals, but closer to the one of the two long sides than the input terminals. Therefore, placement of the second terminals (output terminals) in corners of the semiconductor element (in proximity of the ends of the long sides of the semiconductor element) can be avoided. As a result, a decrease in the connection reliability between the semiconductor element and the display panel at the corners of the semiconductor element can be avoided. When the semiconductor element is mounted on the display panel, the end portions of the semiconductor element can be distorted due to the heat. The distortion is most severe at the corners of the semiconductor element, which can prevent sufficient connection with the display panel. Therefore, as described above, it is especially advantageous to avoid the placement of the second terminals (output terminals) at the corners of the semiconductor element and thereby suppress the decrease in connection reliability between the semiconductor element and the display panel.

In the semiconductor element having the aforementioned plurality of input terminals, the plurality of output terminals are preferably connected to the plurality of panel terminals of the display panel through an anisotropic conductive layer. If the semiconductor element is mounted on the display panel using an anisotropic conductive layer and the output terminals (second terminals) are arranged to the corners of the semiconductor element, it often becomes difficult for resin included in the anisotropic conductive layer to be pushed out from between the output terminals (second terminals) and the panel terminals in the corners of the semiconductor element. This leads to the decrease in the connection reliability between the semiconductor element and the display panel. Therefore, as is the case with the above-described semiconductor element having the plurality of input terminals, it is especially advantageous to avoid the placement of output terminals (second terminals) at the corners of the semiconductor element and thereby suppress the decrease in the connection reliability between the semiconductor element and the display panel.

In the semiconductor element according to the above-described first aspect, a plurality of output terminals are preferably arranged to form a plurality of rows along the long sides. When the output terminals are arranged to form a plurality of rows, the line width and spacing (L/S) of wirings connected to the panel terminals of the display panel corresponding to the output terminals of the semiconductor element decreases. Therefore, in the above-described semiconductor element of the first aspect, it is especially advantageous to arrange the second terminals closer to the other of the two long sides than the first terminals and thereby increase the line width and spacing (L/S) of the wirings connected to the panel terminals.

The above-described semiconductor element according to the first aspect may also be configured so that the first terminals include one of gate terminals and source terminals and that the second terminals include the other of the gate terminals and the source terminals.

A display device according to a second aspect of the present invention includes the semiconductor element according to the above-described configuration and a display panel having the semiconductor element mounted thereon and a display section. The display panel includes a plurality of panel terminals arranged at positions corresponding to the plurality of output terminals of the semiconductor element and a plurality of wirings that are connected to the plurality of panel terminals and formed to extend to the display section. This configuration makes it possible to obtain a display device that is capable of suppressing the decrease in reliability of the wirings.

In the above-described display device according to the second aspect, preferably the plurality of panel terminals include a plurality of third terminals arranged at positions corresponding to the plurality of first terminals of the semiconductor device and also a plurality of fourth terminals arranged at positions corresponding to the plurality of second terminals thereof; wirings connected to the fourth terminals have slanted portions that extend in a direction slanted relative to the long side of the main surface of the semiconductor element; and at least some of the slanted portions are arranged within a mounting area for mounting the semiconductor element. This configuration allows for an increased area for disposing the slanted portions of the wirings by the amount of the displacement of at least a part of the slanted portions of the wiring into the mounting area. This further allows for an increase in the line width and spacing (L/S) of the slanted portions of the wirings. As a result, the decrease in reliability of the wirings can be further suppressed.

In the above-described display device in which the panel terminals include the third and fourth terminals, at least some of the wirings connected to the fourth terminals are preferably arranged so as to intersect with the short sides of the semiconductor element in a plan view. This arrangement allows for an increased area for disposing the wirings, and therefore the line width and spacing (L/S) of the wirings can be increased.

In the above-described display device in which the panel terminals include the third and fourth terminals, portions of the wirings neighboring the connections to the third and fourth terminals are preferably formed to extend, in a plan view, in the direction towards one of the two long sides of the semiconductor element. This configuration allows for easy placement of portions of the wirings neighboring the connections to the third and fourth terminals within the mounting area. As a result, the area for disposing wirings can be easily increased.

Effects of the Invention

According to the present invention, as described above, a semiconductor element capable of suppressing the decrease in reliability of the wirings and a display device equipped with such a semiconductor element can be obtained with ease.

DETAILED DESCRIPTION OF THE INVENTION

Embodiment 1

A configuration of a liquid crystal display device 1 equipped with a driver IC 10 according to Embodiment 1 of the present invention is described below with reference to FIGS. 1 to 4. Here, a liquid crystal display device 1 is one example of "display device" of the present invention.

Figure 1:
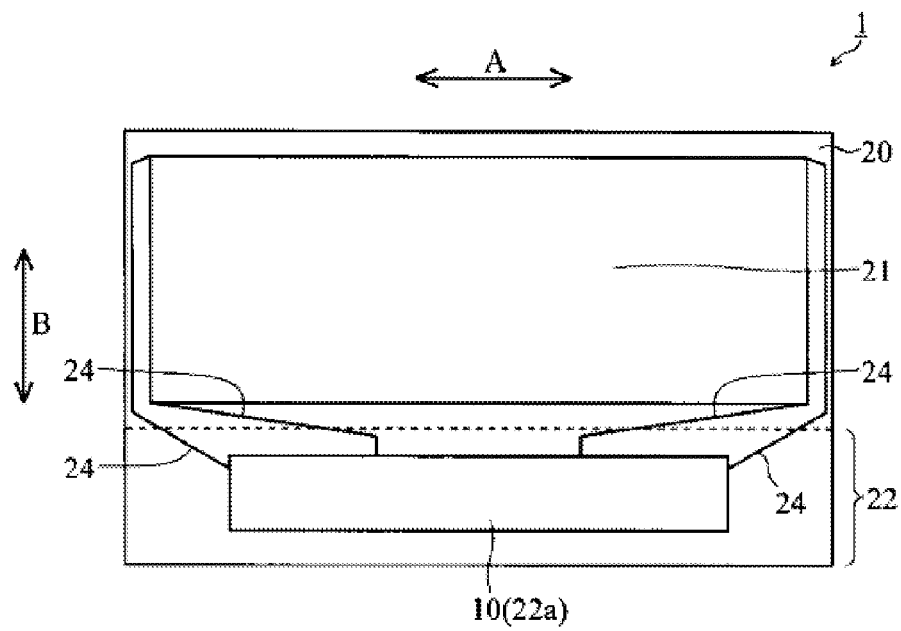
FIG. 1 is a plan view showing a configuration of a liquid crystal display device equipped with a driver IC according to Embodiment 1 of the present invention.

As shown in FIG. 1, a liquid crystal display device 1 according to Embodiment 1 of the present invention is equipped with a driver IC (Integrated Circuit) 10 and a liquid crystal display panel 20 that is composed of a glass substrate with the driver IC 10 mounted thereon. Here, the driver IC 10 is one example of "semiconductor element" of the present invention, and the liquid crystal display panel 20 is one example of "display panel" of the present invention.

Figure 2:
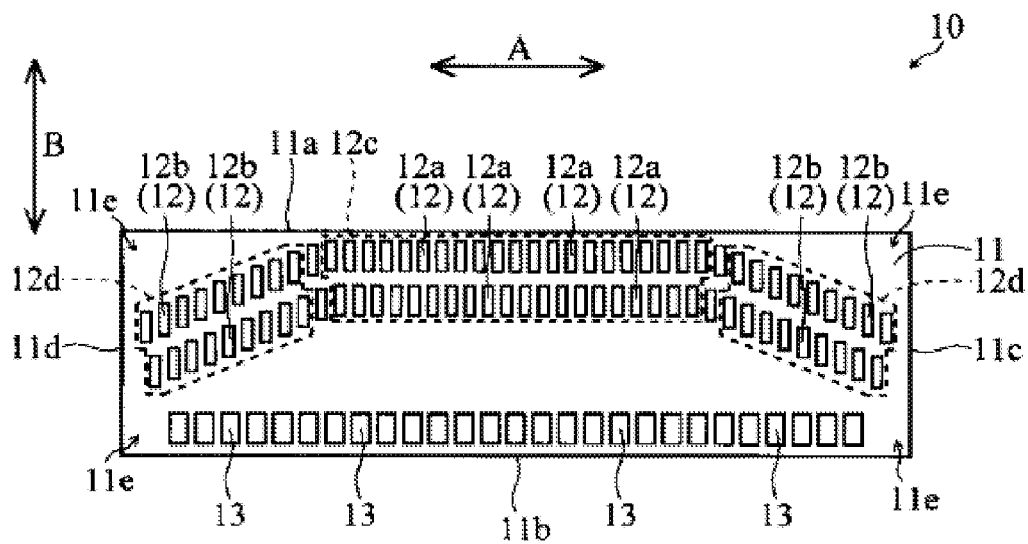
FIG. 2 is a plan view showing a configuration of the driver IC according to Embodiment 1 of the present invention shown in FIG. 1.

As shown in FIG. 2, the driver IC 10 includes a main surface 11 of a rectangular shape having two long sides 11a and 11b and two short sides 11c and 11d. On the main surface 11, a plurality of output bumps 12 and a plurality of input bumps 13 are provided in the direction along the long sides 11a and 11b (direction A), respectively. The plurality of output bumps 12 have less area than the input bumps 13 and are electrically connected to a display section 21 of the liquid crystal display panel 20, which is described later. On the other hand, the plurality of input bumps 13 are electrically connected to the outside of the liquid crystal display panel 20. Here, the output bump 12 is one example of "output terminal" of the present invention.

The plurality of output bumps 12 disposed about the center of the direction A (they are source bumps 12a, which are described later) are arranged close to the long side 11a, and the plurality of input bumps 13 are arranged close to the long side 11b. The plurality of output bumps 12 are arranged to form two rows of terminals. Additionally, the plurality of output bumps 12 are arranged in a staggered fashion. The plurality of input bumps 13 are arranged to form a row of terminals, which is parallel to the long side 11b. All of the plurality of output bumps 12 are formed in identical shape and size, and all of the plurality of input bumps 13 are formed in identical shape and size as well.

The plurality of output bumps 12 are arranged in the direction A at a pitch of 16 μm, for example. Also, the plurality of output bumps 12 include a plurality of (hundreds of) source bumps 12a that are arranged about the center of the long side 11a and also a plurality of (hundreds of) gate bumps 12b that are arranged towards the ends of the long side 11a. The plurality of source bumps 12a constitute a source output section 12c, and the plurality of gate bumps 12b constitute a gate output section 12d. Here, the source bump 12a is one example of "first terminal" or "source terminal" of the present invention, and the gate bump 12b is one example of "second terminal" or "gate terminal" of the present invention.

In Embodiment 1, the plurality of gate bumps 12b are arranged closer to the long side 11b than the plurality of source bumps 12a. Also, the plurality of gate bumps 12b (output bumps 12) are arranged closer to the long side 11a than the plurality of input bumps 13.

In Embodiment 1, the plurality of source bumps 12a are arranged parallel to the long side 11a. On the other hand, the plurality of gate bumps 12b are disposed progressively closer to the long side 11b from the center of the long side 11a towards the ends of the long side 11a. That is, the plurality of gate bumps 12b are not arranged parallel to the long side 11a.

As shown in FIG. 1, the liquid crystal display panel 20 includes a display section 21 and a margin section 22 that is formed along an edge of the liquid crystal display panel 20. In the margin section 22, a mounting area 22a for mounting the driver IC 10 is provided.

Figure 3:
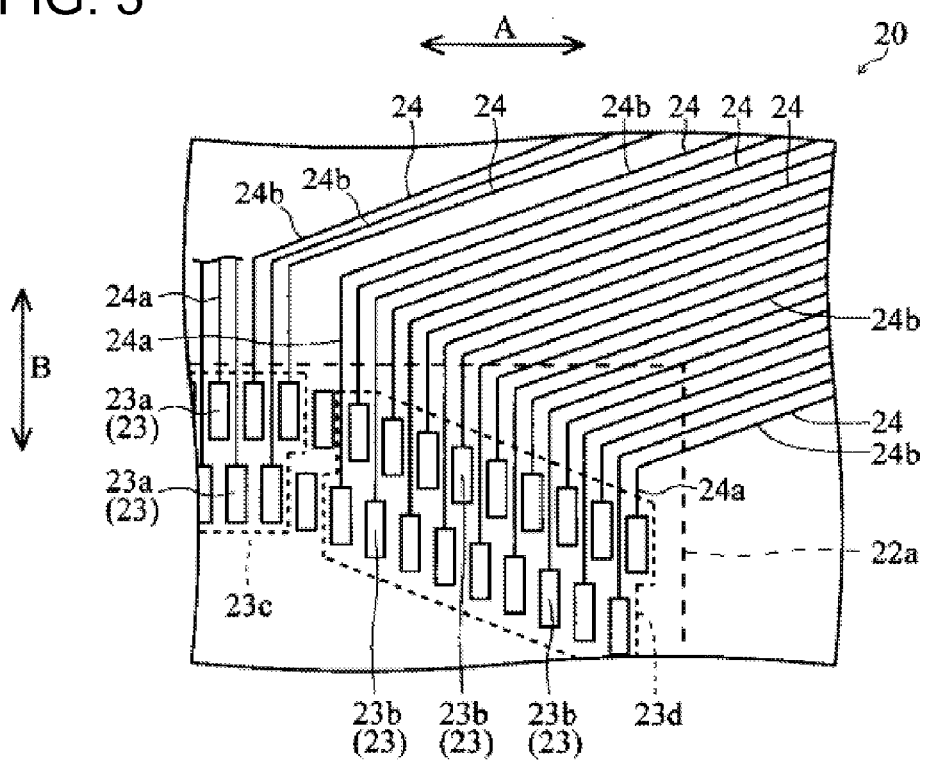
FIG. 3 is a plan view showing a configuration of a liquid crystal display panel of the liquid crystal display device according to Embodiment 1 of the present invention shown in FIG. 1.

In the mounting area 22a, as shown in FIG. 3, a plurality of pads 23 are formed at positions corresponding to the plurality of output bumps 12 of the driver IC 10 (see FIG. 2), and a plurality of pads (not shown) are also formed at positions corresponding to the plurality of input bumps 13 of the driver IC 10 (see FIG. 2). Here, the pad 23 is one example of "panel terminal" of the present invention.

The pads 23 include a plurality of source pads 23a arranged at positions corresponding to the plurality of source bumps 12a (see FIG. 2) and a plurality of gate pads 23b arranged at positions corresponding to the plurality of gate bumps 12b (see FIG. 2). The plurality of source pads 23a constitute a source section 23c, and the plurality of gate pads 23b constitute a gate section 23d. Here, the source pad 23a is one example of "third terminal" of the present invention, and the gate pad 23b is one example of "fourth terminal" of the present invention.

A plurality of wirings 24 that are formed to extend to the display section 21 are connected to the source pads 23a and the gate pads 23b (see FIG. 1). The source pads 23a are connected to one side of the display section 21 in the direction B through the wirings 24, and the gate pads 23b are connected to respective sides of the display section 21 in the direction A through the wirings 24.

Also, in Embodiment 1, the wiring 24 includes a portion 24a that extends, in a plan view, towards the long side 11a of the driver IC 10 in a direction perpendicular to the long side 11a (direction B), and a slanted portion 24b that extends, in a plan view, in a direction slanted relative to the long side 11a of the driver IC 10. Here, the portion 24a is one example of "portion neighboring the connections to third and fourth terminals of wirings" of the present invention.

Also, the entire slanted portions 24b of the wirings 24 connected to the source pads 23a are disposed outside the mounting area 22a. On the other hand, part of the slanted portions 24b of the wirings 24 connected to the gate pads 23b are disposed inside the mounting area 22a.

Further, all of the wirings 24 connected to the source pads 23a are arranged so as to, in a plan view, intersect with the long side of the mounting area 22a, i.e., the side closer to the display section 21 (long side 11a of the driver IC 10). Some of the wirings 24 connected to the gate pads 23b are arranged so as to, in a plan view, intersect with the long side of the mounting area 22a, i.e., the side closer to the display section 21 (long side 11a of the driver IC 10), and the rest of the wirings 24 connected to the gate pads 23b are, in a plan view, arranged so as to intersect with short sides of the mounting area 22a (short sides 11c and 11d of the driver IC 10).

Figure 4:
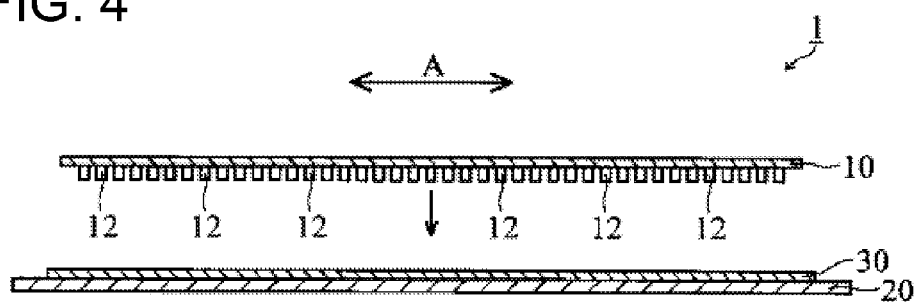
FIG. 4 is a cross-sectional view showing a condition in which the driver IC according to Embodiment 1 of the present invention shown in FIG. 1 is being mounted on a liquid crystal display panel.

In the liquid crystal display device 1, as shown in FIG. 4, when mounting the driver IC 10 to the liquid crystal display panel 20, the driver IC 10 is bonded to the liquid crystal display panel 20 by thermocompression with an ACF 30 sandwiched between the output bumps 12 and input bumps 13 of the driver IC 10 (see FIG. 2) and pads 23 (see FIG. 3) and other pads (not shown) of the liquid crystal display panel 20. During thermocompression, the resin included in the ACF 30 is compressed by the driver IC 10 and is pushed out from between the output bumps 12 and input bumps 13 of the driver IC 10 and the pads 23 and other pads (not shown) of the liquid crystal display panel 20. Here, the ACF 30 is one example of "anisotropic conductive layer" of the present invention.

According to Embodiment 1, as described above, the gate bumps 12b are arranged closer to the long side 11b than the source bumps 12a, thereby making it possible to arrange the gate pads 23b of the liquid crystal display panel 20 corresponding to the gate bumps 12b closer to the long side 11b than the source pads 23a of the liquid crystal display panel 20 corresponding to the source bumps 12a. That is, the gate pads 23b can be placed away from the display section 21. This configuration increases the area for disposing the wirings 24 by the amount of the displacement towards the long side 11b, and therefore the line width and spacing (L/S) of the wirings 24 can be increased. For this reason, when reducing the width of the margin section 22 of the liquid crystal display panel 20 in the direction B, an increase in wiring resistance due to an insufficient width of the wirings 24 and leaks between the wirings due to an insufficient spacing between the lines of the wirings 24a, which could be caused by variations in manufacturing, for example, can be suppressed. As a result, decrease in reliability of the wirings 24 can be suppressed.

According to Embodiment 1 as described above, the gate bumps 12b are arranged closer to the long side 11b than the source bumps 12a, but closer to the long side 11a than the input bumps 13, thereby preventing the gate bumps 12b (output bumps 12) from being placed towards the corners 11e of the driver IC 10 (areas adjacent to the end portions of the long sides 11a and 11b of the driver IC 10; see FIG. 2). As a result, the decrease in connection reliability between the driver IC 10 and the liquid crystal display panel 20 at the corners 11e of the driver IC 10 can be suppressed. When the driver IC 10 is mounted on the liquid crystal display panel 20, the end portions of the driver IC 10 can be distorted due to heat. The distortion is most severe at the corners 11e of the driver IC 10, which can prevent sufficient connection with the liquid crystal display panel 20. Also, as described above, when the driver IC 10 is mounted on the liquid crystal display panel 20 using the ACF 30, if the output bumps 12 are arranged towards the corners 11e of the driver IC 10, it might be hard to push out the resin included in the ACF 30 from between the output bumps 12 of the driver IC 10 and the pads 23 of the liquid crystal display panel 20 at the corners 11e of the driver IC 10. This leads to the decrease in connection reliability between the driver IC 10 and the liquid crystal display panel 20. Therefore, as shown in Embodiment 1, it is especially advantageous to avoid the placement of output bumps 12 towards the corners 11e of the driver IC 10 and thereby suppress the decrease in connection reliability between the driver IC 10 and the liquid crystal display panel 20.

Also, in Embodiment 1 described above, the plurality of output bumps 12 are arranged in two rows that are arranged in the direction along the long sides 11a and 11b (direction A). When the output bumps 12 are arranged to form a plurality of rows, as in this example, the line width and spacing (L/S) of the wirings 24 decrease. Therefore, it is especially advantageous to arrange the gate bumps 12b closer to the long side 11b than the source bumps 12a and thereby increase the line width and spacing (L/S) of the wirings 24, as in the case of the driver IC 10.

Also, according to Embodiment 1 described above, some of the slanted portions 24b are placed inside the mounting area 22a, which increases the area for disposing the slanted portions 24b of the wirings 24 by the amount of the displacement of the slanted portions 24b of the wirings 24 into the mounting area 22a. This configuration increases the line width of the slanted portion 24b of the wiring 24 and line spacing of the slanted portion 24b of the wiring 24 (L/S). As a result, decrease in reliability of the wirings 24 can be further suppressed.

Also, according to Embodiment 1 described above, some of the wirings 24 connected to the gate pads 23b are arranged so as to intersect with short sides of the mounting area 22a (short sides 11c and 11d of the driver IC 10) in a plan view. This configuration increases the area for disposing the wirings 24, and therefore increases the line width and spacing (L/S) of the wirings 24.

Embodiment 2

Embodiment 2 is described with reference to FIGS. 5 and 6. In Embodiment 2, unlike Embodiment 1, a plurality of gate bumps 42b of a driver IC 40 are arranged parallel to a long side 11a.

Figure 5:
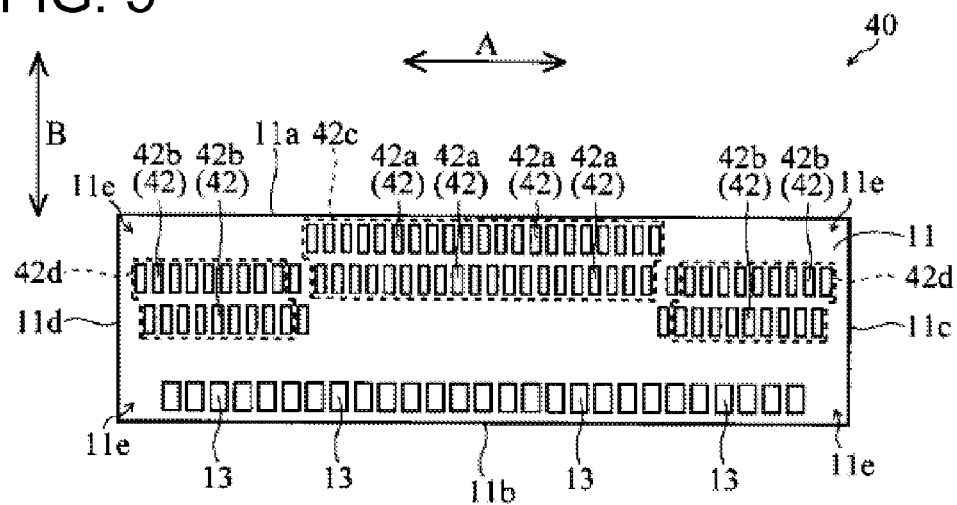
FIG. 5 is a plan view showing a configuration of a driver IC according to Embodiment 2 of the present invention.

On a main surface 11 of the driver IC 40 of Embodiment 2 of the present invention, as shown in FIG. 5, a plurality of output bumps 42 and a plurality of input bumps 13 are provided and arranged in the direction along the long side 11a (direction A). Here, the driver IC 40 is one example of "semiconductor element" of the present invention, and the output bump 42 is one example of "output terminal" of the present invention.

The plurality of output bumps 42 are arranged to form two rows of terminals. Also, the plurality of output bumps 42 include a plurality of (hundreds of) source bumps 42a arranged near the center of the long side 11a and a plurality of (hundreds of) gate bumps 42b arranged towards the ends of the long side 11a. The plurality of source bumps 42a constitute a source output section 42c, and the plurality of gate bumps 42b constitute a gate output section 42d. Here, the source bump 42a is one example of "first terminal" and "source terminal" of the present invention, and the gate bump 42b is one example of "second terminal" and "gate terminal" of the present invention.

According to Embodiment 2, the plurality of gate bumps 42b are arranged closer to the long side 11b than the plurality of source bumps 42a. Specifically, two rows of terminals that constitute the plurality of output bumps 42 are arranged at a predetermined pitch in the direction B, and the gate bumps 42b are arranged closer to the long side 11b by a distance that is the same as the predetermined pitch (the pitch of the two rows of terminals in the direction B) than the source bumps 42a.

The gate bumps 42b may be arranged closer to the long side 11b than the source bumps 42a by a distance greater than the predetermined pitch (the pitch of the two rows of terminals in the direction B) or may be arranged closer to the long side 11b by a distance smaller than the predetermined pitch (the pitch of the two rows of terminals in the direction B).

Also, in Embodiment 2, the plurality of source bumps 42a are arranged in parallel to the long side 11a, and the plurality of gate bumps 42b are arranged in parallel to the long side 11a as well.

Figure 6:
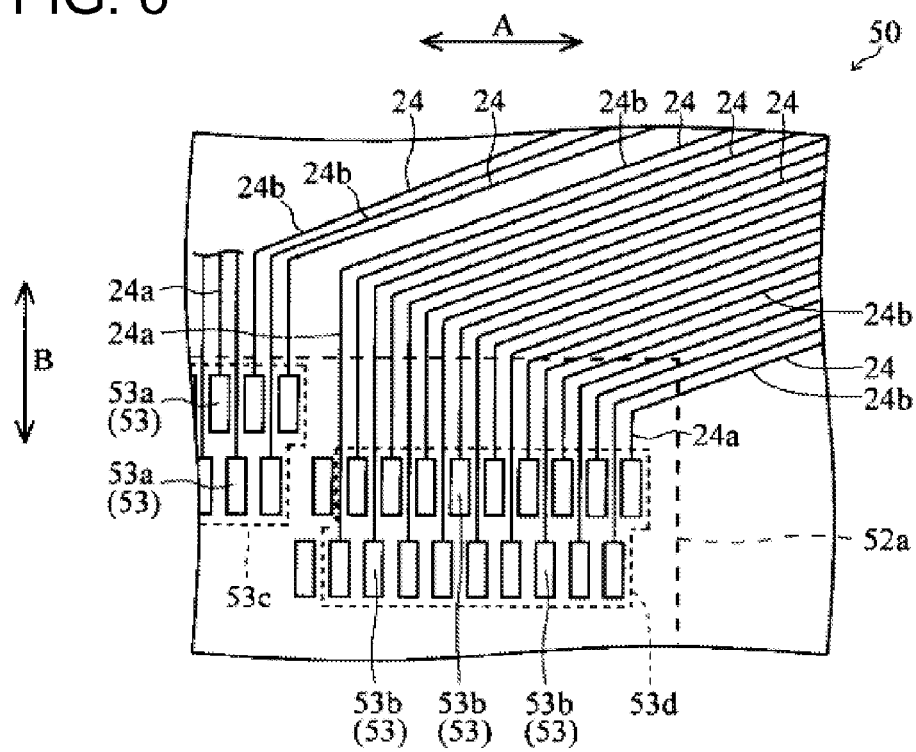
FIG. 6 is a plan view showing a configuration of a liquid crystal display panel of a liquid crystal display device according to Embodiment 2 of the present invention shown in FIG. 5.

In a liquid crystal display panel 50, as shown in FIG. 6, a mounting area 52a for mounting the driver IC 40 (see FIG. 5) is provided. Here, the liquid crystal display panel 50 is one example of "display panel" of the present invention.

In the mounting area 52a, a plurality of pads 53 are formed at positions corresponding to the plurality of output bumps 42 of the driver IC 40 (see FIG. 5), and a plurality of pads (not shown) are also formed at positions corresponding to the plurality of input bumps 13 of the driver IC 40 (see FIG. 5). Here, the pad 53 is one example of "panel terminal" of the present invention.

The pads 53 include a plurality of source pads 53a arranged at positions corresponding to the plurality of source bumps 42a (see FIG. 5) and a plurality of gate pads 53b arranged at positions corresponding to the plurality of gate bumps 42b (see FIG. 5). The plurality of source pads 53a constitute a source section 53c, and the plurality of gate pads 53b constitute a gate section 53d. Here, the source pad 53a is one example of "third terminal" of the present invention, and the gate pad 53b is one example of "fourth terminal" of the present information.

Also, a plurality of wirings 24 that are formed to extend to a display section (not shown) is connected to the source pads 53a and the gate pads 53b.

Other structures and effects of Embodiment 2 are similar to those of the aforementioned Embodiment 1.

It should be understood that the embodiments disclosed herein are merely for illustration in all respects and do not limit the present invention. The scope of the present invention is defined not by the above descriptions, but by the claims of the present invention. The present invention includes any modifications within the equivalent meaning and scope of the claims.

For example, in the above-described embodiments, examples are shown in which the display panel and the display device are applied to a liquid crystal display panel and a liquid crystal display device, respectively. However, the present invention is not limited to these examples, and present invention can be applied to display panels and display devices other than a liquid crystal display panel and a liquid crystal display device.

Also, in the above-described embodiments, examples are provided in which a driver IC is mounted on a display panel (liquid crystal display panel). However, the present invention is not limited to those examples, and a semiconductor element other than a driver IC may also be mounted on a display panel.

Also, in the above-described embodiments, examples are provided in which a plurality of output bumps are arranged to form two rows of terminals. However, the present invention is not limited to those examples, and a plurality of output bumps may also be arranged to form a single row of terminals or three or more rows of terminals.

Also, in the above-described embodiments, examples are provided in which both gate bumps arranged closer to a short side 11c and gate bumps arranged closer to a short side 11d are disposed closer to a long side 11b than source bumps. However, the present invention is not limited to those examples, and only one of the gate bumps arranged closer to a short side 11c and the gate bumps arranged closer to a short side 11d may be disposed closer to the long side 11b than the source bumps.

Figure 7:
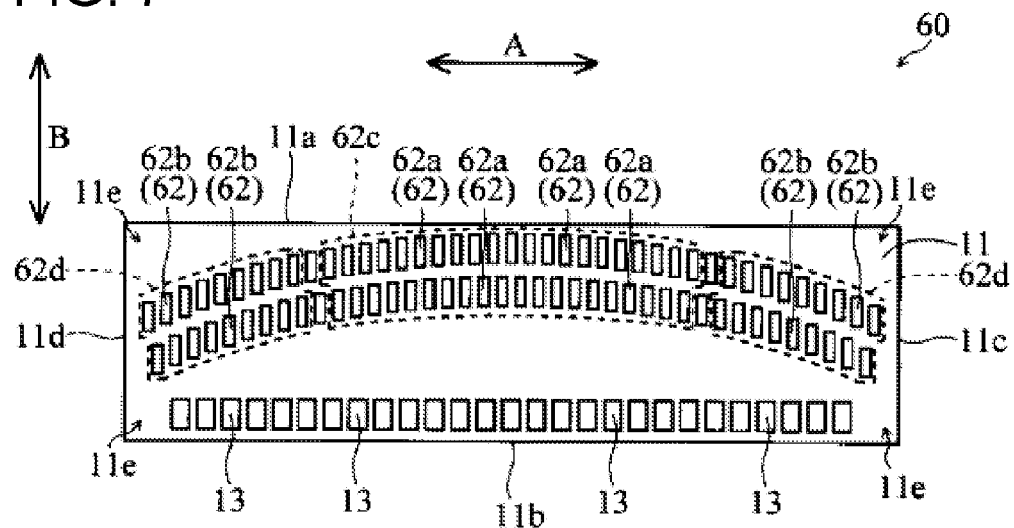
FIG. 7 is a plan view showing a configuration of a driver IC according to Modification 1 of the present invention.

Also, in the above-described Embodiment 1, an example is provided in which a plurality of source bumps 12a are aligned in parallel to the long side 11a, and a plurality of gate bumps 12b are arranged progressively closer to a long side 11b from the center of a long side 11a towards the ends thereof. However, the present invention is not limited to such example, and as in the case with a driver IC 60 of Modification 1 shown in FIG. 7, a plurality of source bumps 62a may be aligned not in parallel to the long side 11a, and all of a plurality of output bumps 62 (the plurality of source bumps 62a and a plurality of gate bumps 62b) may be arranged progressively closer to the long side 11b from the center of a long side 11a towards the ends thereof. Here, in FIG. 7, "62c" denotes a source output section constituted of a plurality of source bumps 62a, and "62d" denotes a gate output constituted of a plurality of gate bumps 62b.

Figure 8:
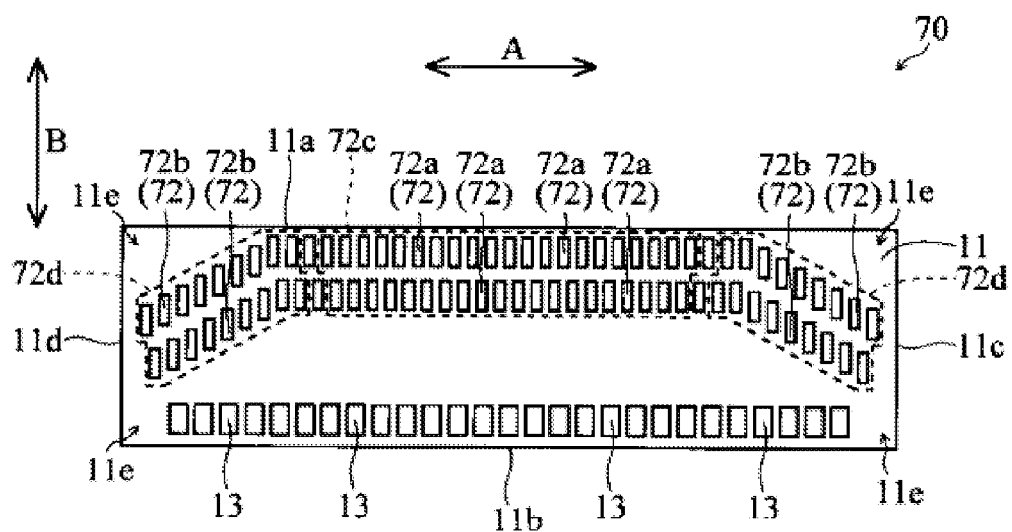
FIG. 8 is a plan view showing a configuration of a driver IC according to Modification 2 of the present information.
Figure 9:
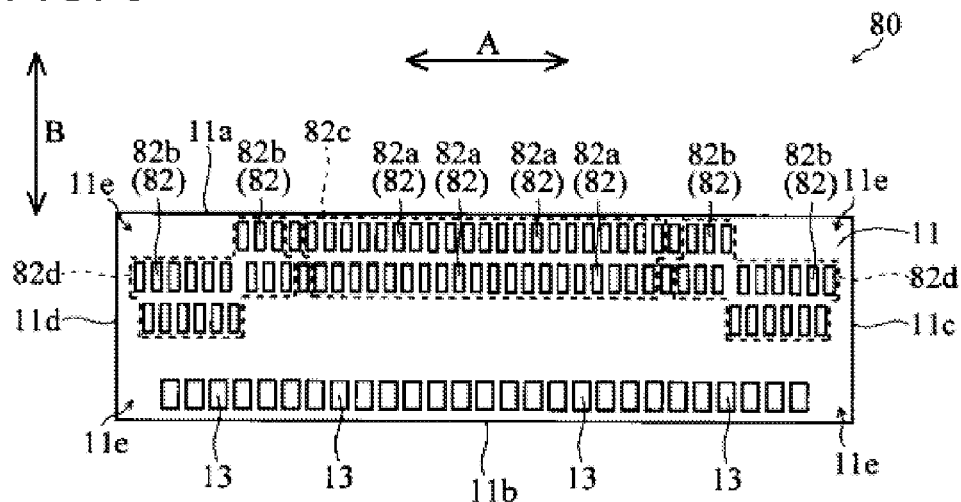
FIG. 9 is a plan view showing a configuration of a driver IC according to Modification 3 of the present information.

Also, in the above-described embodiments, examples are provided in which all gate bumps are arranged closer to the long side 11b than source bumps. However, the present invention is not limited to those examples and may also be configured as shown in Modification 2 of the present invention shown in FIG. 8 or as shown in Modification 3 of the present invention shown in FIG. 9. That is, as shown in FIG. 8, only some of the gate bumps 72b among output bumps 72 of a driver IC 70 may be arranged progressively closer to a long side 11b from the center of the long side 11a towards the ends thereof. Here, in FIG. 8, "72c" denotes a source output section constituted of a plurality of source bumps 72a, and "72d" denotes a gate output section constituted of a plurality of gate bumps 72b. Similarly, as shown in FIG. 9, only some of the gate bumps 82b among output bumps 82 of a driver IC 80 may be arranged closer to the long side 11b than source bumps 82a. Here, in FIG. 9, "82c" denotes a source output section constituted of a plurality of source bumps 82a, and "82d" denotes a gate output section constituted of a plurality of gate bumps 82b.

Also, in the above-described embodiments, examples are provided in which a driver IC is configured so that gate bumps are not arranged in the corners of the driver IC. However, the present invention is not limited to those examples and may also be configured as shown in Modification 4 of the present invention shown in FIG. 10 or as shown in Modification 5 of the present invention shown in FIG. 11.

Figure 10:
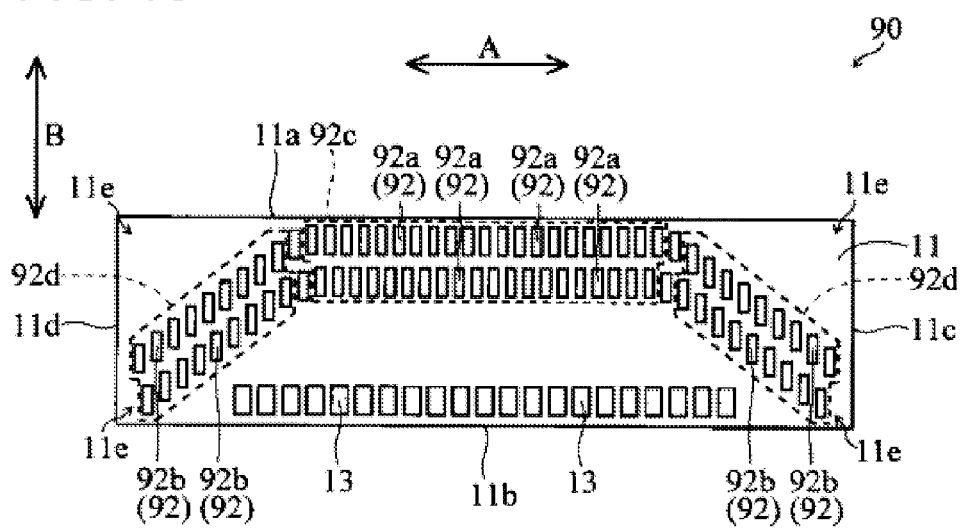
FIG. 10 is a plan view showing a configuration of a driver IC according to Modification 4 of the present information.

Specifically, as shown in FIG. 10, gate bumps 92b among output bumps 92 of a driver IC 90 may be arranged progressively closer to the long side 11b from the center of the long side 11a towards the ends thereof, and gate bumps 92b adjacent to short sides 11c and 11d of the driver IC 90 may be arranged in the corners 11e of the long side 11b of the driver IC 90. Here, in FIG. 10, "92c" denotes a source output section constituted of a plurality of source bumps 92a, and "92d" denotes a gate output section constituted of a plurality of gate bumps 92b.

Figure 11:
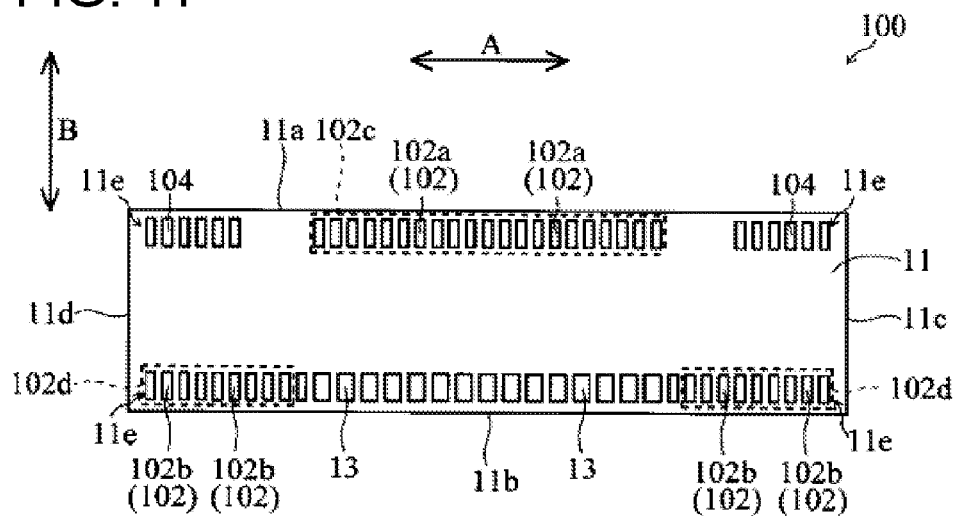
FIG. 11 is a plan view showing a configuration of a driver IC according to Modification 5 of the present information.
Figure 12:
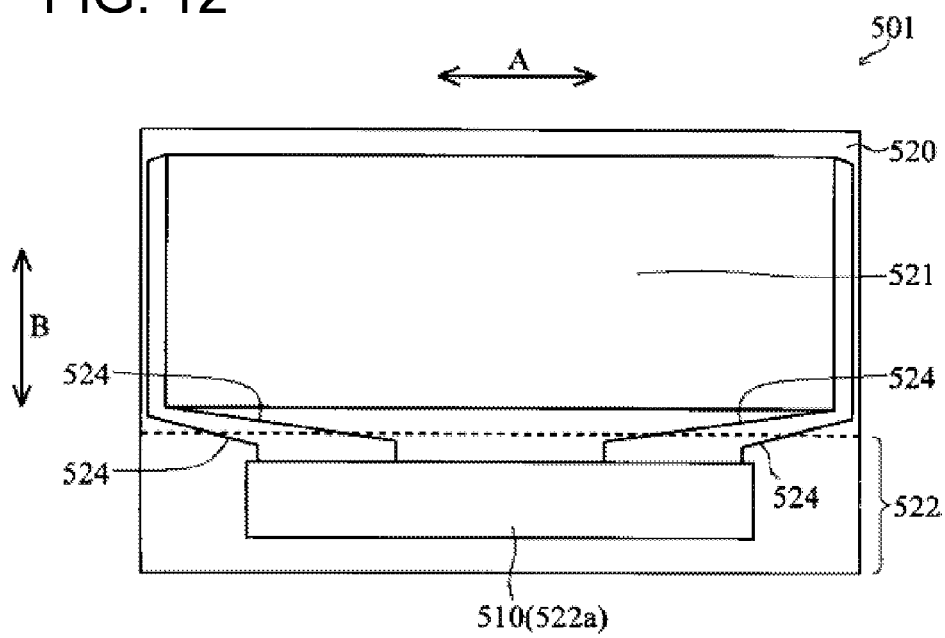
FIG. 12 is a plan view showing a configuration of a display device equipped with a semiconductor element of a conventional example.
Figure 13:
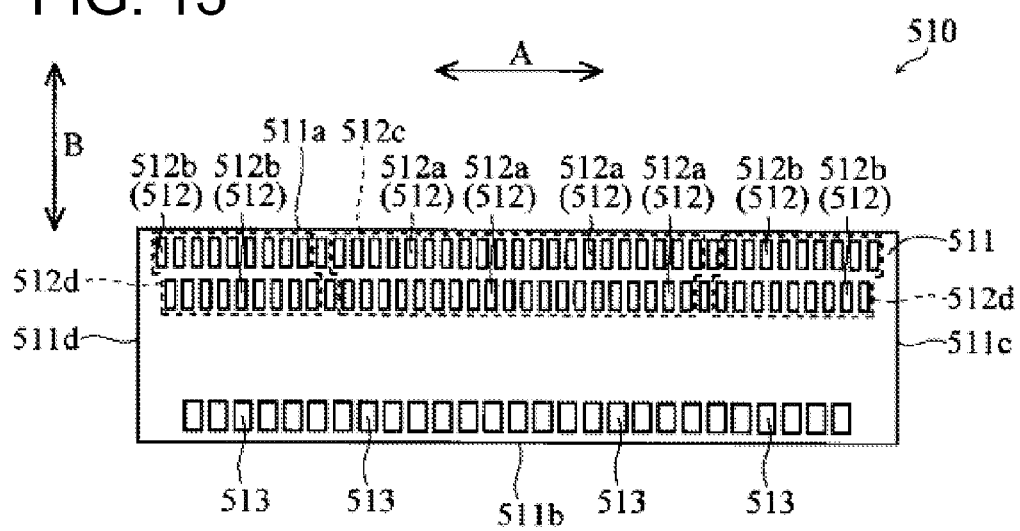
FIG. 13 is a plan view showing a configuration of the semiconductor element of the conventional example shown in FIG. 12.
Figure 14:
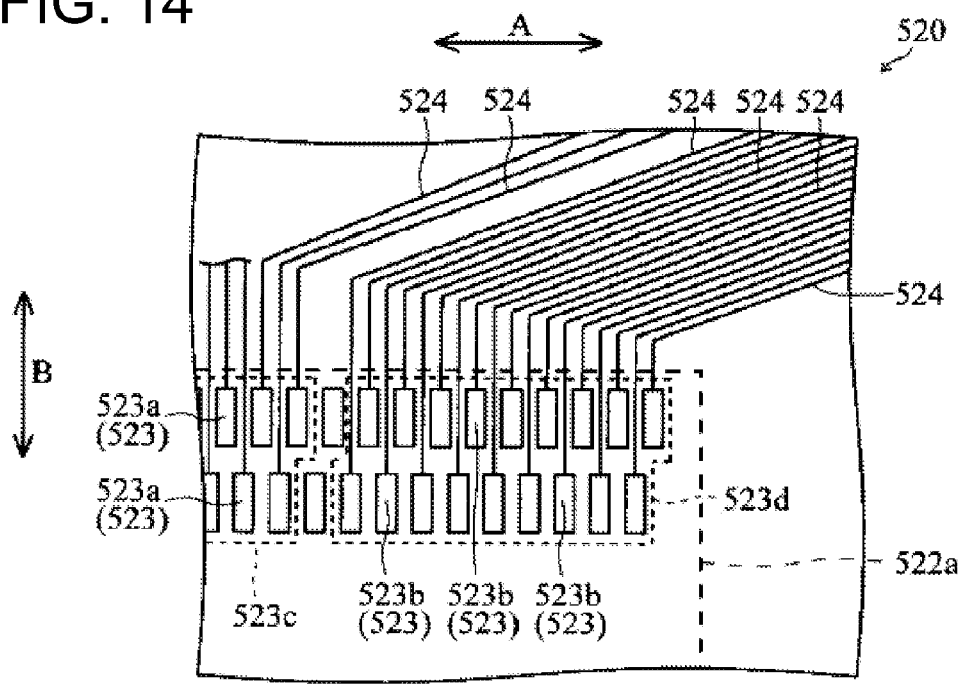
FIG. 14 is a plan view showing a configuration of a display panel of the display device of the conventional example shown in FIG. 12.
Figure 15:
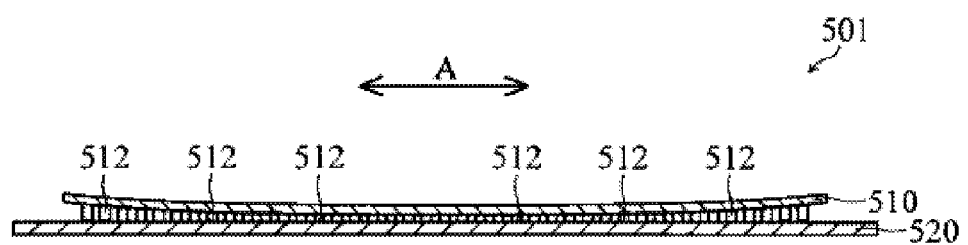
FIG. 15 is a cross-sectional view showing a condition in which the semiconductor element of the conventional example shown in FIG. 12 is mounted on a display panel.

And, as shown in FIG. 11, gate bumps 102b among output bumps 102 of a driver IC 100 may be arranged close to a long side 11b of the driver IC 100 and may also be aligned with input bumps 13 to form a single straight row. Here, dummy bumps 104 may be provided close to a long side 11a of the driver IC 100. This configuration makes it possible to prevent the inclination of the driver IC 100 towards the long side 11a (to maintain the parallelism of the driver IC 100) when the driver IC 100 is compressed and mounted on a liquid display panel 20, thereby further suppressing the decrease in connection reliability. Also, the dummy bumps 104 may be configured so as not to contribute to operations of a liquid crystal panel 20. That is, wirings may not be connected to dummy pads (not shown) of the liquid crystal display panel 20 connected to the dummy bumps 104. In FIG. 11, "102c" denotes a source output section constituted of a plurality of source bumps 102a, and "102d" denotes to a gate output section constituted of a plurality of gate bumps 102b.

Also, in the above-described embodiments, examples are provided in which a driver IC is mounted on a liquid crystal display panel using an ACF. However, the present invention is not limited to those examples, and a driver IC may also be mounted on a liquid crystal display panel using an ACP (anisotropic conductive paste; anisotropic conductive layer) or other types of adhesive layers. Alternatively, bumps of the driver IC and pads of the liquid crystal display panel may also be directly bonded together without using an adhesive layer.

Also, in the above-described embodiments, examples are provided in which source bumps are disposed near the center of a long side and gate bumps are disposed towards the ends thereof. However, the present invention is not limited to those examples, and gate bumps may also be disposed near the center of the long side and source bumps may be disposed towards the ends thereof.

Also, in the above-described embodiments, examples are provided in which a plurality of input bumps are aligned in parallel with a long side. However, the present invention is not limited to those examples, and a plurality of input bumps may be configured in the same manner as a plurality of output bumps. That is, input bumps arranged towards the ends of the direction A may be arranged closer to a long side 11a than input bumps arranged near the center of the direction A.

Also, in the above-described embodiments, examples are provided in which a driver IC has bumps and a display panel (liquid crystal display panel) has pads. However, the present invention is not limited to those examples, and a driver IC may have pads and a display panel may have bumps.

DESCRIPTION OF REFERENCE CHARACTERS

1 Liquid crystal display device (display device)
10, 40, 60, 70, 80, 90, 100 Driver IC (semiconductor element)
11 Main surface
11a, 11b Long side
11c, 11d Short side
12, 42, 62, 72, 82, 92, 102 Output bump (output terminal)
12a, 42a, 62a, 72a, 82a, 92a, 102a Source bump (first terminal, source terminal)
12b, 42b, 62b, 72b, 82b, 92b, 102b Gate bump (second terminal, gate terminal)
20, 50 Liquid crystal display panel (display panel)
21 Display
22a, 52a Mounting area
23, 53 Pad (panel terminal)
23a, 53a Source pad (third terminal)
23b, 53b Gate pad (fourth terminal)
24 Wiring
24a Portion (portion of wiring adjacent to the third terminal and fourth terminal of wiring)
24b Slanted portion
30 ACF (anisotropic conductive layer)

The invention claimed is:

1. A semiconductor element to be mounted on a display panel that includes a display section, comprising:
 a main surface in a rectangular shape having two long sides and two short sides; and
 a plurality of output terminals provided on the main surface, arranged in a direction along said long sides and to be electrically connected to the display section of the display panel,
 wherein the plurality of output terminals include a plurality of first terminals arranged near a center of said long side and a plurality of second terminals arranged towards ends of said long side,
 wherein at least the first terminals among the plurality of output terminals are arranged adjacent to one of said two long sides, and
 wherein at least some of the second terminals are arranged closer to the other of said two long sides than the first terminals.

2. The semiconductor element according to claim 1, wherein the second terminals are arranged progressively closer to said other of said two long sides from the center of the long side towards the ends thereof.

3. The semiconductor element according to claim 2, wherein all of the plurality of output terminals are arranged progressively closer to said other of said two long sides from the center of the long side towards the ends thereof.

4. The semiconductor element according to claim 1, further comprising:
   a plurality of input terminals provided on the main surface and arranged in a direction along said long sides,
   wherein the plurality of input terminals are arranged adjacent to said other of said two long sides, and
   wherein at least some of the second terminals are arranged closer to said one of said two long sides than the input terminals.

5. The semiconductor element according to claim 4, wherein the plurality of output terminals are connected to a plurality of panel terminals of the display panel through an anisotropic conductive layer.

6. The semiconductor element according to claim 1, wherein the plurality of output terminals are arranged to form a plurality of rows that are arranged in a direction along said long sides.

7. The semiconductor element according to claim 1, wherein said first terminals include one of gate terminals and source terminals, and said second terminals include the other thereof.

8. A display device comprising:
   the semiconductor element according to claim 1; and
   a display panel having the semiconductor element mounted thereon and a display section,
   wherein the display panel includes a plurality of panel terminals that are arranged at positions corresponding to the plurality of output terminals of the semiconductor element, and a plurality of wirings that are connected to the plurality of panel terminals and are formed so as to extend to the display section.

9. The display device according to claim 8, wherein the plurality of panel terminals include a plurality of third terminals that are arranged at positions corresponding to the plurality of first terminals of the semiconductor element, and a plurality of fourth terminals that are arranged at positions corresponding to the plurality of second terminals thereof,
   wherein the wirings connected to the fourth terminals have slanted portions that extend in a direction slanted relative to said long sides of the main surface of the semiconductor element, and
   wherein at least some of the slanted portions are arranged inside a mounting area for mounting the semiconductor element.

10. The display device according to claim 9, wherein at least some of the wirings connected to the fourth terminals are arranged so as to intersect with the short sides of the semiconductor device in a plan view.

11. The display device according to claim 9, wherein portions of the wirings adjacent to connections to the third terminals and the fourth terminals thereof are formed so as to extend towards said one of the two long sides of the semiconductor element in a plan view.

\* \* \* \* \*